(12) United States Patent
Chevallier et al.

(10) Patent No.: US 7,719,876 B2
(45) Date of Patent: May 18, 2010

(54) PRESERVATION CIRCUIT AND METHODS TO MAINTAIN VALUES REPRESENTING DATA IN ONE OR MORE LAYERS OF MEMORY

(75) Inventors: Christophe J. Chevallier, Palo Alto, CA (US); Robert Norman, Pendleton, OR (US)

(73) Assignee: Unity Semiconductor Corporation

( * ) Notice: Subject to any disclaimer, the term of this patent is extended or adjusted under 35 U.S.C. 154(b) by 125 days.

(21) Appl. No.: 12/221,136

(22) Filed: Jul. 31, 2008

(65) Prior Publication Data

US 2010/0027314 A1    Feb. 4, 2010

(51) Int. Cl.
    *G11C 7/00*    (2006.01)
(52) U.S. Cl. .................................... 365/148; 365/158
(58) Field of Classification Search ................ 365/148, 365/158
    See application file for complete search history.

(56) References Cited

U.S. PATENT DOCUMENTS

| | | | |
|---|---|---|---|
| 6,317,375 B1 | 11/2001 | Perner |
| 6,331,944 B1 | 12/2001 | Monsma et al. |
| 6,504,221 B1 | 1/2003 | Tran et al. |
| 6,608,773 B2 | 8/2003 | Lowrey et al. |
| 6,667,900 B2 | 12/2003 | Lowrey et al. |
| 6,707,712 B2 | 3/2004 | Lowery |
| 6,717,874 B1 | 4/2004 | Perner et al. |
| 6,751,147 B1 | 6/2004 | Smith et al. |
| 6,754,107 B2 | 6/2004 | Khouri et al. |
| 6,813,177 B2 | 11/2004 | Lowrey et al. |
| 6,826,094 B1 | 11/2004 | Perner et al. |
| 6,836,422 B1 | 12/2004 | Perner et al. |
| 6,847,544 B1 | 1/2005 | Smith et al. |
| 6,865,104 B2 | 3/2005 | Perner |
| 6,885,573 B2 | 4/2005 | Sharma et al. |
| 6,894,938 B2 | 5/2005 | Smith et al. |
| 6,898,134 B2 | 5/2005 | Smith et al. |
| 6,940,744 B2 | 9/2005 | Rinerson et al. |
| 6,999,366 B2 | 2/2006 | Perner et al. |
| 7,020,006 B2 | 3/2006 | Chevallier et al. |
| 7,038,948 B2 | 5/2006 | Hamilton et al. |
| 7,042,757 B2 | 5/2006 | Perner |
| 7,046,043 B2 | 5/2006 | Shibata et al. |
| 7,057,258 B2 | 6/2006 | Tran et al. |

(Continued)

OTHER PUBLICATIONS

U.S. Appl. No. 12/001,952, filed Dec. 12, 2007, Norman.

(Continued)

*Primary Examiner*—Michael T Tran

(57) ABSTRACT

Circuitry and methods for restoring data in memory are disclosed. The memory may include at least one layer of a non-volatile two-terminal cross-point array that includes a plurality of two-terminal memory elements that store data as a plurality of conductivity profiles and retain stored data in the absence of power. Over a period of time, logic values indicative of the stored data may drift such that if the logic values are not restored, the stored data may become corrupted. At least a portion of each memory may have data rewritten or restored by circuitry electrically coupled with the memory. Other circuitry may be used to determine a schedule for performing restore operations to the memory and the restore operations may be triggered by an internal or an external signal or event. The circuitry may be positioned in a logic layer and the memory may be fabricated over the logic layer.

5 Claims, 7 Drawing Sheets

U.S. PATENT DOCUMENTS

| | | |
|---|---|---|
| 7,068,204 B1 | 6/2006 | Bathul et al. |
| 7,075,817 B2 | 7/2006 | Rinerson et al. |
| 7,079,436 B2 | 7/2006 | Perner et al. |
| 7,102,948 B2 | 9/2006 | Perner |
| 7,372,753 B1 | 5/2008 | Rinerson et al. |
| 7,379,364 B2 | 5/2008 | Siau et al. |
| 2003/0058728 A1 | 3/2003 | Tran et al. |
| 2003/0103400 A1 | 6/2003 | Van Tran |
| 2004/0125653 A1 | 7/2004 | Tran et al. |
| 2004/0160797 A1 | 8/2004 | Tran et al. |
| 2006/0034124 A1 | 2/2006 | Guterman et al. |
| 2006/0039191 A1 | 2/2006 | Perner et al. |
| 2006/0044878 A1 | 3/2006 | Perner et al. |
| 2006/0050551 A1 | 3/2006 | Perner |
| 2006/0050552 A1 | 3/2006 | Perner et al. |
| 2006/0050582 A1 | 3/2006 | Perner et al. |
| 2007/0159904 A1 | 7/2007 | Tran et al. |
| 2008/0025079 A1* | 1/2008 | Philipp et al. ............... 365/163 |
| 2008/0144357 A1 | 6/2008 | Siau et al. |
| 2008/0159046 A1 | 7/2008 | Rinerson et al. |

OTHER PUBLICATIONS

Noboru Sakimura, et al, "A 512Kb Cross-Point Cell MRAM", IEEE International Solid-State Circuits Conference, 2003, paper 16.1.

* cited by examiner

PRESERVATION CIRCUIT AND METHODS TO MAINTAIN VALUES REPRESENTING DATA IN ONE OR MORE LAYERS OF MEMORY

CROSS-REFERENCE TO RELATED APPLICATIONS

This application incorporates by reference for all purposes U.S. patent application Ser. No. 11/095,026, filed Mar. 30, 2005 and entitled "Memory Using Mixed Valence Conductive Oxides," which has published as U.S. Pub. No. 20060171200.

FIELD OF THE INVENTION

The present invention relates generally to semiconductors and memory technology. More specifically, the present invention relates to data retention in non-volatile memory.

BACKGROUND

A semiconductor memory is generally considered to be one of two types of memory—volatile memory or nonvolatile memory. Each of these types of memory has its limitations. For example, volatile memory technologies generally have relatively lower storage densities and faster access times, as compared to nonvolatile memory technologies. However, volatile memory technologies typically require a constant power source to retain the memory contents, unlike nonvolatile memory technologies, which do not generally require a constant power source.

Two conventional types of volatile memory are dynamic random access memory ("DRAM") and static random access memory ("SRAM"). The relatively simple memory cell structures of DRAM allow for higher performances and higher storage densities. A memory cell in a DRAM cell usually consists of a transistor and a capacitor to store a bit of data. Since capacitors typically leak electrical charge, a DRAM needs to be constantly refreshed to retain the memory contents. Electrical power is typically consumed to refresh a number of memory cells (e.g., every memory cell) in a DRAM, even if the memory or part of the memory is not being used. By contrast, an SRAM cell usually includes several transistors implemented as a flip-flop to store each bit of memory. An SRAM cell is typically sensitive to power glitches, during which some or all of the memory contents are lost. Although an SRAM cell does not require refreshing, it commonly requires constant power to maintain its memory contents, even if the memory or part of the memory is not in use.

Conventional nonvolatile memory, such as Flash memory technology, typically uses complex logic, including state machines and other logic devices, to read and program a memory. Flash memory usually is slower than SRAM or DRAM since Flash memory includes a complex interface and requires erasing and/or programming in blocks of bits. However, Flash memory retains its contents when power is removed from (i.e., is not applied to) the memory.

Flash memory may be implemented as NOR and NAND Flash types. NOR Flash allows dynamic memory access ("DMA") and, thus, is relatively faster than NAND Flash in accessing small amount of data. However, NOR Flash is slower than volatile memory, such as SRAM or DRAM. NAND Flash offers higher densities on a given die size compared with NOR Flash.

There are continuing efforts to improve non-volatile memory technology.

BRIEF DESCRIPTION OF THE DRAWINGS

Various examples are disclosed in the following detailed description and the accompanying drawings.

Figure 1A:
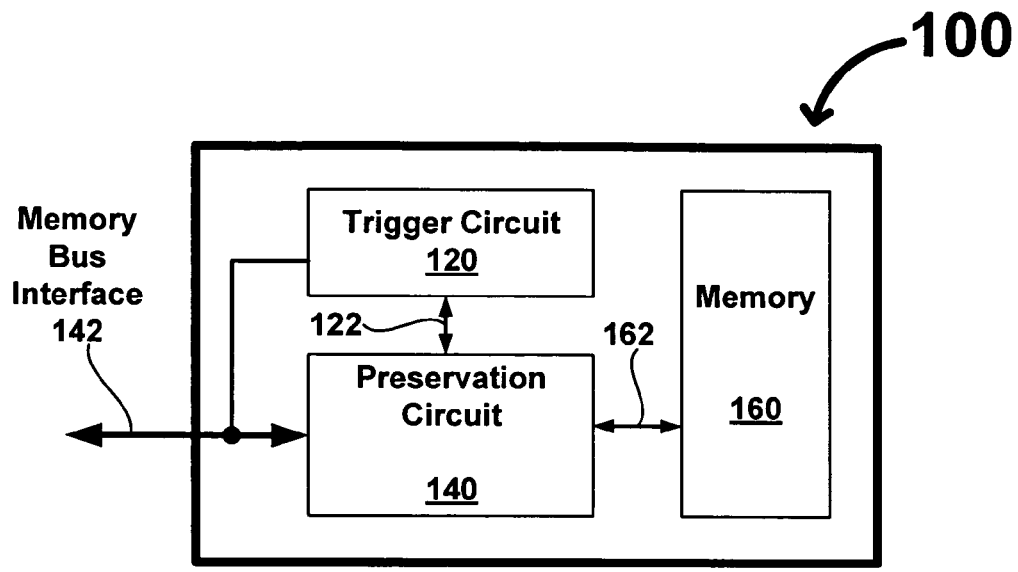
FIG. 1A depicts an exemplary memory device, according to one or more embodiments of the invention.

Although the previous Drawings depict various examples of the invention, the invention is not limited to those specific examples. Furthermore, the depictions are not necessarily to scale.

DETAILED DESCRIPTION

Various embodiments or examples may be implemented in numerous ways, including as a system, a process, an apparatus, or a series of program instructions on a computer readable medium such as a computer readable storage medium or a computer network where the program instructions are sent over optical, metal, electronic, or wireless communication links. In general, operations of disclosed processes may be performed in an arbitrary order, unless otherwise provided in the claims.

A detailed description of one or more examples is provided below along with accompanying figures. The detailed description is provided in connection with such examples, but is not limited to any particular example. The scope is limited only by the claims. Numerous alternatives, modifications, and equivalents are encompassed. Numerous specific details are set forth in the following description in order to provide a thorough understanding. These details are provided as examples and the described techniques may be practiced according to the claims without some or all of the accompanying details. For clarity, technical material that is known in the technical fields related to the examples has not been described in detail to avoid unnecessarily obscuring the description.

In accordance with various embodiments of the invention, a preservation circuit may be configured to preserve values, such as parametric values, that represent the logic states for data (or a datum) stored in a memory that is composed of at least one layer of memory elements. Examples of parametric values include values that represent storage-related parameters of a memory element or cell, including, but not limited to voltages, currents, resistances, amounts of electrical charge (e.g., stored in association with a ferroelectric layer), magnetic fields (e.g., intensities or polarities thereof, such as in association with a Magnetoresistive Random Access Memory, or MRAM) or any other mechanism by which to write and/or read data (or a datum). Thus, a preservation circuit may be used to ensure that a memory retains its data over a variety of conditions, including over time and over a reduction of power (e.g., during brown-out conditions, and/or absence of power). To illustrate the use of a preservation circuit, consider that a memory is fabricated with, for example, deviations in manufacturing parameters (e.g., deviations in process). One type of manufacturing defect may cause degradation (e.g., leakage or drift) of a parametric value, such as a resistive value, which may corrupt the contents of a memory. A preservation circuit may thereby enhance the data retention capabilities of a memory by preserving values that represent certain states of data, according to at least one embodiment.

In one embodiment, the memory may include one or more layers of non-volatile memory elements. In at least one embodiment, the memory may be composed of memory elements having non-volatility characteristics for extended periods of time during which power is not applied to the memory elements storing the data. As used herein, the term "power absence period" may refer, at least in one embodiment, to an amount of time over which a memory element or cell (or a collection thereof) exhibits non-volatility characteristics by maintaining its contents during the absence of power. A power absence period may be expressed in durations of, for example, milliseconds (e.g., 100 milliseconds or more, such as more than 500 milliseconds), seconds, minutes, hours, days, months, etc., as well as a number of access operations (e.g., number of write operations, or read operations). Thus, a non-volatile memory may be characterized as having a power absence period over which it possesses non-volatile capabilities. For example, one type of memory may possess non-volatile capabilities for 90 days (e.g., at standard temperature, pressure, etc.), after which the probability increases that at least one memory cell in the memory might behave as a volatile memory cell. As used herein, the term "non-volatile," in terms of memory, may refer, at least in one embodiment, to the ability of memory to retain data stored therein during a reduction in or an absence of power, regardless of the power absence period associated with the memory.

Memory elements may be two dimensional or three dimensional and may be arranged in a two-terminal or three-terminal memory array, in accordance with various embodiments of the invention. In some examples, techniques such as those described herein enable emulation of multiple memory types for implementation on a single component such as a wafer, substrate, or die. U.S. patent application Ser. No. 11/095,026, filed Mar. 30, 2005 and entitled "Memory Using Mixed Valence Conductive Oxides," is hereby incorporated by reference in its entirety for all purposes and describes non-volatile third dimensional memory elements that may be arranged in a two-terminal, cross-point memory array. Various memory structures are possible with the implementation of the third dimensional memory array. In addition, the non-volatile third dimensional memory elements facilitate the emulation of other memory technologies, with the duplication (i.e., simulation) of interface signals and protocols. For example, the third dimensional memory array may emulate other types of memory, including SRAM, DRAM, and Flash memory, while providing memory combinations within a single component, such as a single integrated circuit.

FIG. 1A depicts an example of a memory device configured to preserve values representing data, according to various embodiments of the invention. In a specific embodiment, memory device 100 includes a trigger circuit 120, a preservation circuit 140, and a memory 160. Connection 122 couples trigger circuit 120 with preservation circuit 140, and connection 162 couples preservation circuit 140 with memory 160. In one embodiment, memory 160 includes multiple layers of memory cells configured to store logic states associated with values, such as resistance values. Preservation circuit 140 may be coupled with the memory cells, such as via connection 162. In operation, preservation circuit 140 may be configured to preserve the resistance values that represent particular logic states. In one embodiment, preservation circuit 140 may be configured to preserve one or more resistance values that represent a particular logic state. As such, preservation circuit 140 may preserve the resistance value of a memory cell so that it falls within a range of resistances that represent a specific logic state, such as logic "1" or a logic "0", for example. Trigger circuit 120 may generate and transmit a trigger signal to preservation circuit 140 via connection 120, which, in turn, performs a preservation operation. In a specific embodiment, a preservation operation includes rewriting data into at least a portion of the memory cells in memory 160 prior to, for example, the expiration of a power absence period. In at least one embodiment, a preservation operation may restore a resistance value for a certain logic state so that the logic state remains substantially unchanged over time during absences of power (i.e., without powering one or more memory elements associated with the resistance value).

Accordingly, preservation circuit 140—in whole or in part—may ensure data retention for memory 160. As such, a memory device 100 that uses preservation circuit 140 may enhance the non-volatile nature of memory 160 to extend its data retention to at least that of known non-volatile memory technologies, such as Flash memory, or longer. In one embodiment, trigger circuit 120 may be configured to initiate a preservation operation on any number of memory locations, and, thus, on any number of memory elements for the memory locations. When a preservation operation is performed on each memory location in memory 160 during a power absence period, then the integrity of the data stored therein is ensured, at least until the end of the power absence period. Consequently, when memory device 100 uses preservation circuit 140 and trigger circuit 120, then data may be retained in memory 160 over multiple power absence periods. In one embodiment, preservation circuit 140 and trigger circuit 120, or the equivalent thereof, may operate to retain data in memory 160 for ten (10) years or longer, with other influencing factors remaining unchanged. In at least one embodiment, trigger circuit 120 may be configured to generate a trigger signal in response to a triggering event. In one example, the triggering event may represent a change (or a sufficient change) in power applied to memory device 100 or any of its constituent elements, such as memory 160. As such, the trigger signal may be a power-up signal that indicates power has been applied to memory device 100 (or any of its constituent elements), according to one embodiment. In this case, the triggering event is a power-up event. In another embodiment, the trigger signal may be a power-down signal that indicates the application of power to memory device 100 has ceased. As such, trigger circuit 120 may be configured to apply a power-down signal to preservation circuit, which, in turn, may perform a preservation operation before power to memory device 100 is sufficiently depleted (e.g., from a battery, capacitor, or other power types of power sources). In this case, the triggering event is a power-down event. Note that the triggering event is not limited to representing changes in power and may represent any other type of event affecting the operation of memory device 100.

Memory device 100 of FIG. 1A is shown to be accessible with a memory bus interface 142. In at least one embodiment, a host computing device (not shown) may be coupled with memory device 100 using memory bus interface 142. As such, the structure and/or functionality of preservation circuit 140 (or portions thereof) may be omitted, and the host may implement the structure and/or functionality for preservation circuit 140. In this instance, the host device may provide power for performing preservation operations. In at least one embodiment, the host computing device is absent, whereby an alternate power source (e.g., a battery) may provide the power for performing preservation operations under control of preservation circuit 140.

In various embodiments, trigger circuit 120 is opportunistic. That is, when external power is applied to trigger circuit 120 may perform preservation operations in an expeditious manner so as to restore values (e.g., resistive values) for as many memory elements as possible while external power is available. Also, trigger circuit 120 may opportunistically use memory bus interface 142 to perform preservation operations during periods of low bus usage by a host, so as not to interfere (or to negligibly affect) read and write operations invoked by the host. Low bus usage may relate to low usage of memory bus interface 142 during low rates of data access between the host and memory 160. In instances where memory device 100 includes or has access to a power source, trigger circuit 120 may recalibrate the rate at which it initiates preservation operations so as to meter the rate at which the power source, such as a battery, expends power. In view of the foregoing, trigger circuit 120 may periodically (or aperiodically) send signals ("trigger signals") via connection 122 to initiate, for example, a rewrite operation on memory 160 as a preservation operation. In some embodiments, a rewrite operation includes reading contents of memory 160 and rewriting the contents back to memory 160, for example, via connection 162. As such, memory device 100 may be configured to rewrite its contents at least once before the expiration of each power-absence period, thereby maintaining the contents until the next power-absence period.

In some instances, the power-absence period may dictate the minimum rate at which to preserve memory contents. In particular, the longer the power-absence period, the slower the preservation rate, which, in turn, may reduce the power consumed to perform preservation operations. For instance, if a memory is able to maintain its contents without power for a period of, for example, thirty (30) days, power that otherwise might be used to power memory 160 may be shut off for up to a period of thirty days of inactivity. Power may be selectively turned on when the memory is accessed (e.g., by a host) or when memory contents need to refresh to maintain through the next period of 30 days.

Note that while FIG. 1A shows trigger circuit 120 coupled via connection 122 to preservation circuit 140 for communicating at least trigger signals, trigger circuit 120 may be communicatively coupled with preservation circuit 140 by other structures (not shown). In some designs, either trigger circuit 120 or preservation circuit 140, or both, may be external to memory device 100 (not shown). In various embodiments, memory bus interface 142 may be connected with a memory bus 170 (FIG. 1C) or connected with a memory controller 180 (not shown). In other instances, trigger circuit 120 may be included in preservation circuit 140 (FIG. 1C). In other embodiments, memory device 100 does not include a trigger circuit. Instead, one or more software, middleware, firmware, driver, and the like, may provide functions similar to trigger circuit 120. The software, middleware, firmware, driver, and the like may each be referred to as a "software utility" (not shown). For example, preservation circuit 140 may be configured to communicate with at least one software-based trigger utility, either in place of, or, in addition to, trigger circuit 120. In some embodiments, preservation circuit 140 may be included in a memory chip (FIG. 1C). In other embodiments, memory device 100 does not include a preservation circuit, as described above. Instead, one or more software utilities may provide functions similar to preservation circuit 140, but may be implemented in a host device (not shown). For example, one or more software trigger utilities may be configured to access memory 160 (e.g., directly) to perform preservation operations. In at least one embodiment, memory device 100 includes more than one preservation circuits 140 that may interact with one or more memory chips (FIG. 1C). Memory 160 may be formed with one memory chip, or two or more memory chips. A memory chip may be formed with a single layer of memory cells, or with two or more layers of memory cells (FIG. 1B).

Figure 1B:
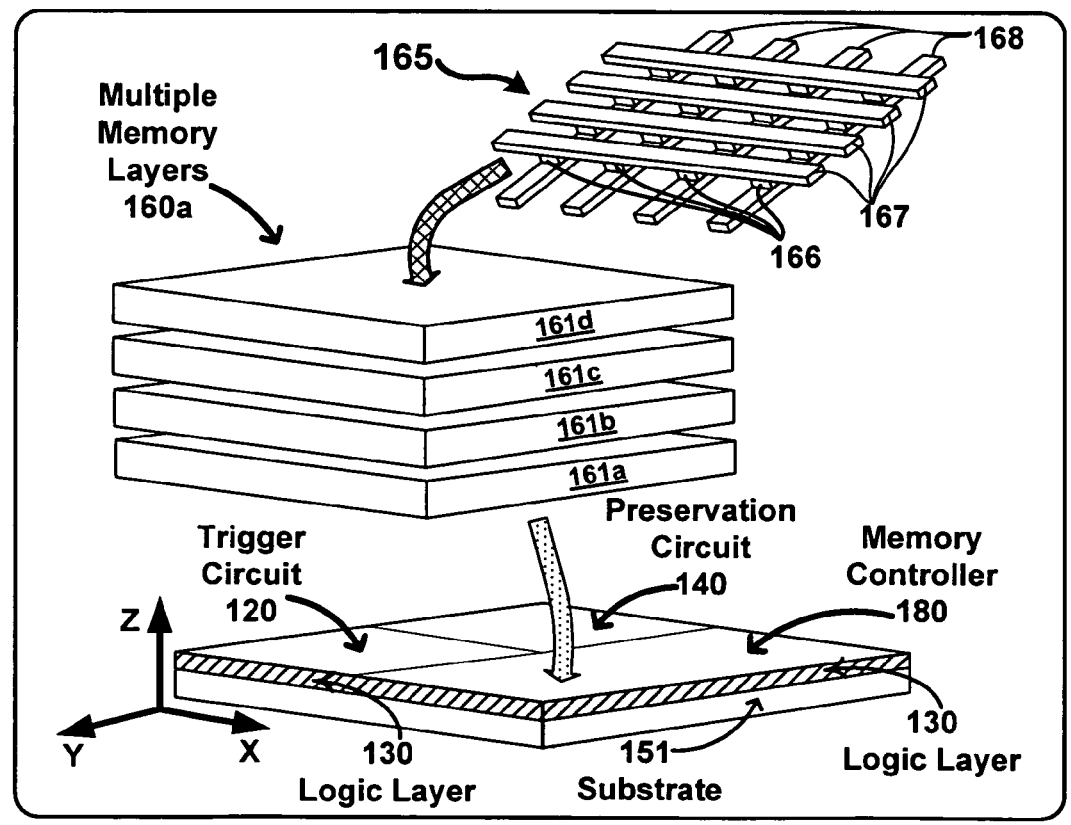
FIG. 1B depicts an alternative exemplary memory device with multiple layers of memory, according to one or more embodiments of the invention.
Figure 1C:
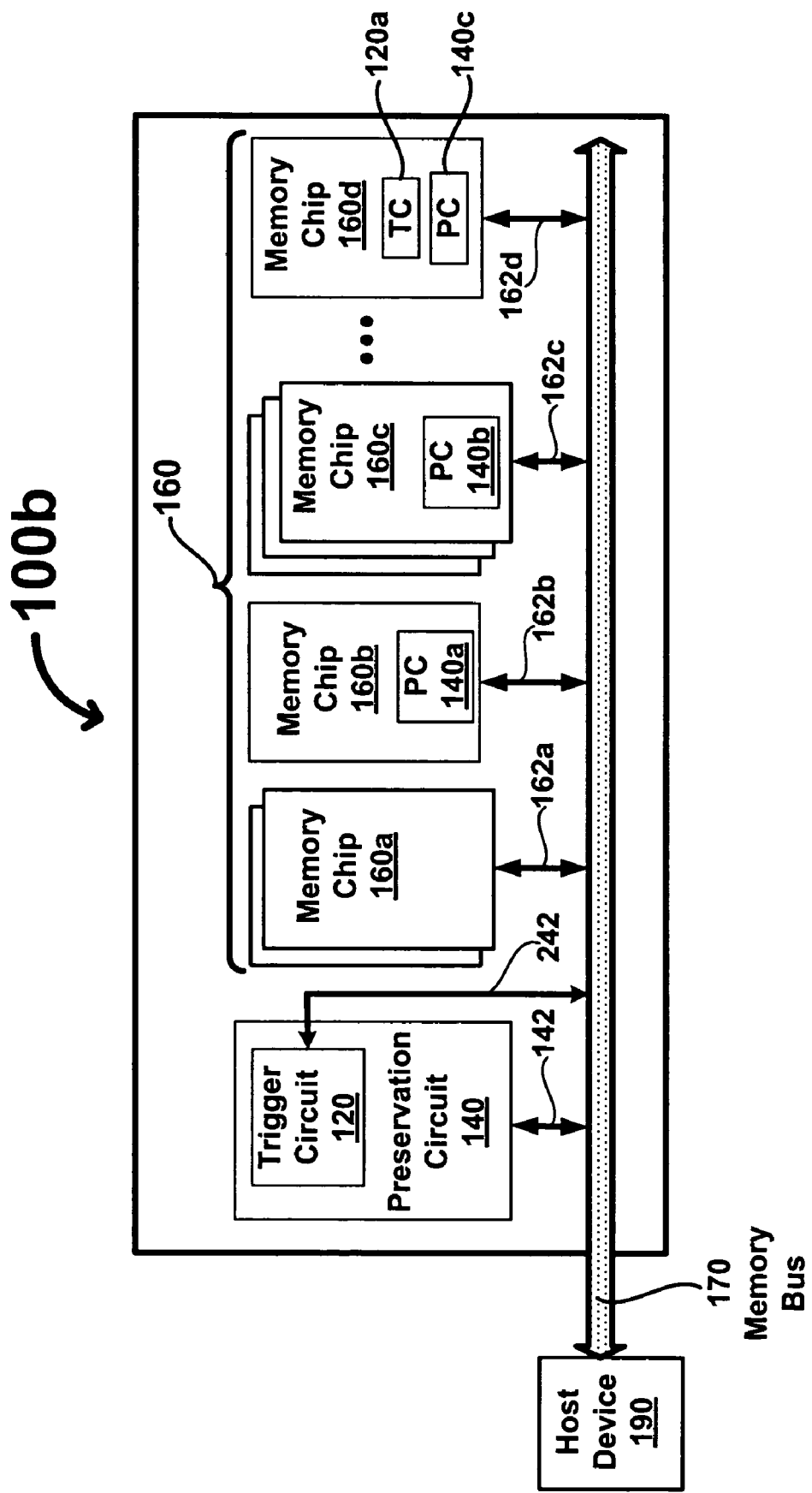
FIG. 1C depicts an exemplary memory device with mixed memory configurations, according to one or more embodiments of the invention.

FIG. 1B depicts a memory device 100a, according to at least one specific embodiment of the invention. Memory device 100a includes multiple memory layers 160a (e.g., layers 161a, 161b, 161c, and 161d vertically disposed along the Z-axis) and a logic layer 130. Memory device 100b may include more of fewer layers than those depicted in FIG. 1B. In some embodiments, each memory cell may be a two-terminal element in multiple memory layers 160a, as described in U.S. patent application Ser. No. 11/095,026, entitled "Memory Using Mixed Valence Conductive Oxides," which describes one example of a two-terminal memory cell. In other embodiments, each memory cell may include a three-terminal element, such as a memory element in a Flash memory device or SRAM memory device.

Logic layer 130 may be electrically coupled with the multiple memory layers 160a by way of a plurality of vias or ports (not shown) to communicate control signals and data signals. In a specific embodiment, a subset of these ports may form one or more connections to preservation circuit 140 (e.g., of FIG. 1B) and/or memory bus 170 (e.g., of FIG. 1C). In the example shown, logic layer 130 may include trigger circuit 120, preservation circuit 140, and memory controller 180 of FIG. 1B. In some implementations, logic layer 130 does not include either trigger circuit 120 or preservation circuit 140, or both. The logic layer 130 may be fabricated on a substrate 151 (e.g., a silicon substrate) and may comprise CMOS circuitry for implementing the circuits 120, 140, and 180, and other circuitry, for example. The multiple memory layers 160a may be fabricated over the logic layer 130 (e.g., along the Z-axis) with the layers 161a, 161b, 161c, and 161d vertically stacked over the substrate 151 and electrically coupled with circuitry in the logic layer 130 using an interconnect structure (not shown), such as vias and the like, for example. The configuration depicted in FIG. 1B may also be implemented for a single layer of memory (e.g., the memory 160) fabricated over the substrate 151 with the single layer of memory in electrical communication with circuitry in the logic layer 130.

Each layer of memory (e.g., layers 161a, 161b, 161c, and 161d) or the single layer of memory 160 (FIG. 1A) may include a non-volatile two-terminal cross-point memory array 165. The array 165 includes a plurality of first conductive traces 167 (e.g., row conductors) and a plurality of second conductive traces 168 (e.g., column conductors). The plurality of first conductive traces 167 do not come into direct contact with one another and the plurality of second conductive traces 168 do not come into direct contact with one another or into direct contact with any of the plurality of first conductive traces 167. Typically, the plurality of first conductive traces 167 and the plurality of second conductive traces 168 are positioned substantially orthogonal to one another. The array 165 includes a plurality of two-terminal memory elements 166 with each memory element positioned at an intersection of one of the first conductive traces with one of the second conductive traces (i.e., is positioned at a crosspoint). A first terminal (not shown) of each memory element 166 is electrically coupled with only one of the plurality of first conductive traces 167 and a second terminal (not shown) of each memory element 166 is electrically coupled with only one of the plurality of second conductive traces 168. Each terminal may include one or more layers of electrically conductive materials and those materials may include glue layers, adhesion layers, anti-reflection layers, anti-diffusion layers, and the like. For example, platinum (Pt) may be used for at least one of the terminals. Each memory element 166 is configured to store data as a plurality of conductivity profiles that can be non-destructively determined by applying a read voltage across the first and second conductive traces (167, 168) that are electrically coupled with the first and second terminals of the memory element 166. Data operations to the array 165 (e.g., read, write, and restore) are effectuated by applying the appropriate magnitude and polarity of a select voltage across the first and second conductive traces (167, 168) of one or more selected memory elements 166. Typically, the magnitude of a read voltage is less than the magnitude of a write voltage so that stored data is not corrupted by the application of the read voltage (i.e., the conductivity profile is not changed by application of the read voltage). For example, the read voltage may have a magnitude of about 3V or less and a write voltage may have a magnitude of about 4V or greater. Circuitry in the logic layer 130 is electrically coupled (e.g., using vias or the like) with the first and second conductive traces (167, 168) of each array 165 and is operative in part, to apply the select voltages to selected memory elements 166 and to sense read currents flowing through the selected memory element 166, for example. Moreover, the circuitry in the logic layer 130 may effectuate data operations to the memory elements 166 in one or more of the arrays 165 using page mode data operations or burst mode data operations.

Figure 5:
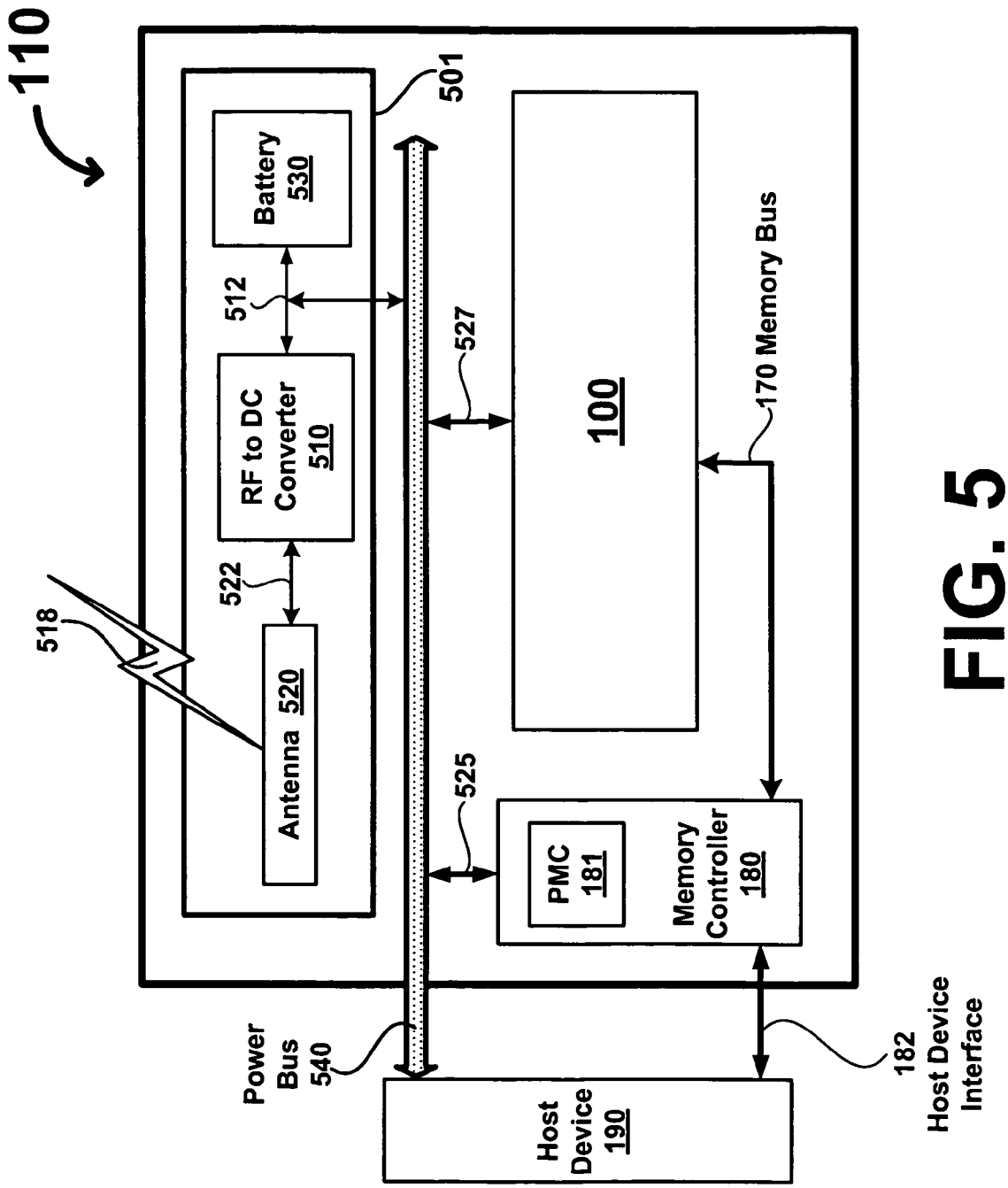
FIG. 5 depicts an exemplary memory device with an on-board power supply, according to one or more embodiments of the invention.

In a specific embodiment, memory controller 180 may perform memory control functions similarly performed by known memory devices, such as a USB memory storage device, a Flash memory card, a DRAM memory device, a SRAM memory device, or the like. For example, when host device 190 (discussed below) transmits write data to memory device 100a, memory controller 180 may apply the appropriate control signals and data to memory 160a to select one or more memory cells for storage. Similarly, in serving a read request by host device 190, memory controller 180 may be configured to locate the address or addresses for the memory cells that hold the requested data, and may retrieve the stored data to host device 190. Memory controller 180 may control access to multiple memory layers 160a via, for example, memory bus 170 of FIG. 1C that may carry both control and data signals. Memory bus 170 of FIG. 1C may be formed with a subset of ports (not shown) in the logic layer 130 and multiple memory layers 160a. In at least one embodiment, trigger circuit 120 and preservation circuit 140 may be formed in one or two integrated circuit ("IC") chips separately from the chip that contains memory controller 180. Memory controller 180 may include a memory bus (not shown) or a host device interface 182 (FIG. 5) that interacts with a memory-using host device 190 (FIG. 5). A memory-using host device 190 may be configured to embed and/or attach more than one memory devices 100 and/or 110 (FIG. 5).

FIG. 1C depicts a variety of possible configurations for an exemplary memory device 100b, according to various embodiments of the invention. Memory 160 may be configured with any number of memory chips. For example, memory 160 may be formed with one, two, four, or more memory chips. FIG. 1C shows at least four memory chips 160a, 160b, 160c, and 160d. Each memory chip may include either a single layer of memory cells or a plurality of layers of memory cells. For example, chips 160a and 160c each may include at least two layers of memory cells. In this example, chips 160b and 160d are depicted as single-layered memory.

In some embodiments, there may be two or more connections 162a to 162d from memory 160. In some cases, one or more connections 162a to 162d may be configured to connect to one or more preservation circuits ("PC") 140, 140a, 140b, and 140c. In other cases, one or more connections 162a to 162d may interface with memory bus 170. In some embodiments, at least one of connections 162a to 162d interfaces with preservation circuit 140, and at least one other of connections 162a to 162d interfaces with memory bus 170. In some embodiments, memory 160 may be configured to communicate with memory bus 170 directly.

In at least one embodiment, memory device 100b may include more than one trigger circuit 120 that may communicate with one or more preservation circuit ("PC") 140, 140a, 140b, and 140c. As shown, memory device 100b may be coupled with host device 190. Memory device 100b may be coupled with, attached to, connected to, or embedded in host device 190 in various ways. For example, memory device 100b may be plugged into a memory slot or port of host device 190 or irremovably fixed to host device 190. The memory slot or port may be adapted to communicate using any protocol, for example, a protocol used in known ports or slots, such as USB, PCMCIA, CompactFlash®, Secure Digital (SD™), Micro SD™, SD High Capacity (SDHC™), Memory Stick™, and xD-Picture™.

Host device 190 may be any device that is capable of using a memory device, such as any host described herein. For example, a host may be a computing device, such as a handheld computer, laptop, desktop, or mainframe system; an electronic device, such as a disk drive, network access storage, network or wireless access point, network router, or network gateway; a consumer electronic device, such as a personal digital assistant (PDA), smart phone, cellular phone, general purpose phone, camera, video recording device, television, radio, audio system, MP3 player, or game console. In some cases, host device 190 may be adapted for use in a vehicle, such as an automobile, boat, ship, airplane, train, and the like. Host device 190 may include at least a processor and at least one input/output (I/O) sub-device, such as an input key, switch, mouse, touch screen, infrared transceiver, wireless interface (e.g., RF), or communication bus. Host device 190 may include a display, screen, or printing sub-device, as well as data storage, such as SRAM, DRAM, or another memory devices. In some embodiments the data storage of host device 190 may be used to temporarily store data that is rewritten back into memory 160 for preservation purposes.

A memory chip in memory device 100b may be formed so as to include a preservation circuit. For example, chips 160b, 160c, and 160d are each shown to contain a preservation circuits ("PC"), 140a, 140b, and 140c, respectively. The preservation circuits may be positioned in the logic layers 130 of their respective memory chip. A preservation circuit inside a chip may perform preservation operations, such as rewrite operations, by sending rewrite instructions to the memory in the corresponding chip. In some embodiments, a preservation circuit inside a chip, such as PC 140c, may be configured to send rewrite instructions to other part of memory 160, for example, to another chip, such as chip 160a. Similarly, a memory chip in memory device 100b may be formed so as to include a trigger circuit. For example, chip 160d may be formed to include a trigger circuit ("TC") 120a. A trigger circuit inside a chip may provide trigger signals to a corresponding preservation circuit inside that chip. The trigger circuit 120 may be positioned in the logic layers 130 of their respective memory chips. In some embodiments, a trigger circuit inside a chip, such as trigger circuit 120a, may be configured to provide trigger signals to one or more preservation circuits outside that chip, such as any of preservation circuits 140, 140a, and 140b. In some embodiments, memory device 100b does not include trigger circuit 120 or preservation circuit 140, or both. In such embodiments, the functionalities of trigger circuit 120 and preservation circuit 140 may be provided by one or more entities (not shown), such as host device 190, which may be external to memory device 100b. The external entity may use hardware, software, or both to implement an equivalent functionality of the trigger and preservation circuits.

In some implementations, trigger circuit 120 of FIG. 1C may interface via a memory bus interface 242 with one or more preservation circuits 140, 140a, and 140b. Thus, preservation circuit 140 may send rewrite instructions or commands via memory bus interface 242 to memory 160 or part of memory 160. In at least one embodiment in which one or more memory chips include separate preservation circuits, such as the memory chips 160b, 160c, and 160d, the respective memories in the chips may be rewritten by the associated preservation circuits 140a, 140b, and 140c. Two or more trigger circuits, for example 120 and 120a, may be configured to issue trigger signals at different rates due to different memories having different power absence periods. To illustrate, consider that trigger circuit 120 may be configured to send one trigger signal every 10 seconds while trigger circuit ("TC") 120a may be configured to send one trigger signal every 12 hours. Similarly, two or more preservation circuits, for example, 140, 140a, 140b and 140c, may be configured to institute different preservation or restoration schemes, when two preservation circuits, such as, 140a and 140b, are responding to the same trigger circuit or trigger signals that are implemented at the same rate. In some embodiments, different portions of memory 160, such as different chips, may be rewritten or restored by different methods, independent of other portions. In other embodiments, memory 160 may be rewritten by a single process. In at least one embodiment, a portion of memory 160 is configured to be rewritten or restored by a software utility. In at least one embodiment, a portion of memory 160 may be configured to so as not to be rewritten or restored.

Figure 2A:
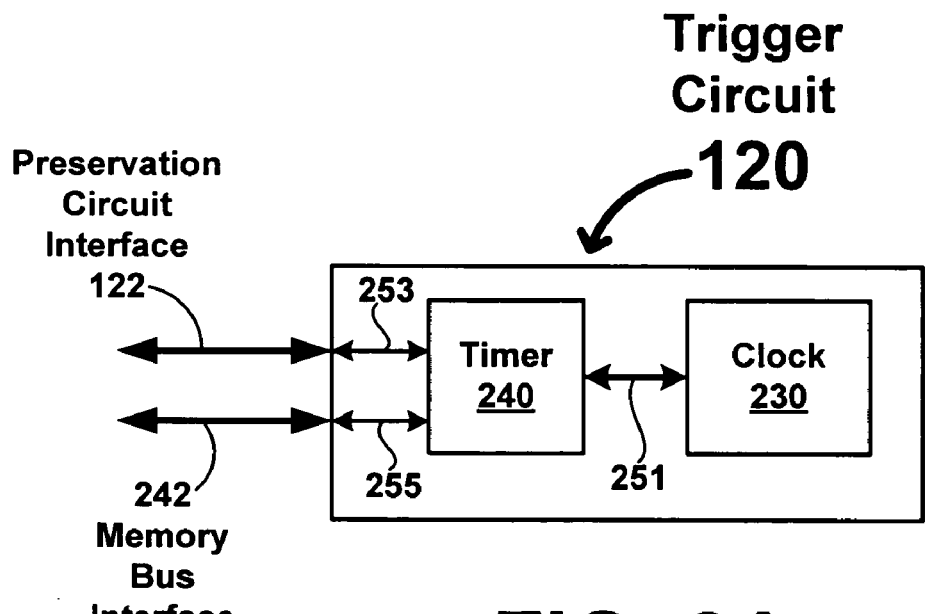
FIG. 2A depicts a block diagram of an exemplary trigger circuit, according to one or more embodiments of the invention.

FIG. 2A depicts a trigger circuit 120, according to one or more embodiments of the invention. Trigger circuit 120 may include a clock 230 and a timer 240, as well as one or both of preservation circuit interface 122 and memory bus interface 242, which is configured to communicate signals, such as trigger signals, reset signals, power-on signals, power-off signals, etc. Clock 230 may be configured with any of the known clock sources, such as resistor-capacitor ("RC") oscillators, silicon oscillators, crystals oscillators, and ceramic resonators, for example. In some embodiments, clock 230 may be configured with a RC oscillator or circuit. In at least one embodiment, clock 230 is a real-time clock. For example, a real-time clock may include a circuit that utilizes an accurate clock source to generate time signals representative of units of time, such as seconds, minutes, and hours. In some embodiments, a real-time clock may be configured to generate time signals representative of units of time, such as days, weeks, and/or months. Clock 230 also may be configured with a clock source that oscillates at any frequency. In some embodiments, the desired time signals of clock 230 may be slower than the frequency of a clock source, such as a real-time clock source. In these embodiments, the output of the clock source may be attached to a counter or a ripple counter (discussed below) to slow down the frequency of the clock source to generate the desired time signals.

In at least one embodiment, timer 240 may be connected with a real-time clock, and may configured to generate a trigger signal at least once per "wake-up" period, which may be in any unit of time, such as milliseconds. Timer 240 may operate by counting to (i.e., reaching) a wake-up time, which triggers or causes timer 240 to send a trigger signal. The wake-up time may be referred to as a triggering event, according to one embodiment. A wake-up time may be set at manufacturing, by programming, by software, or by a switch (not shown). A switch may be a mechanical switch, such as a jumper port, toggle button, or pin-size contact button, or other mechanical selection devices. A switch may also be an electronic switch, such as a transistor, a relay, a pass gate, a register storing one or more data bits, or the like. A switch may have one or more positions, each representing a different wake-up time setting. Wake-up time settings for one or more switch positions may be modified by programming, by software, or by other manipulations. A switch may have one or more positions that are shared with, or used by other, components or circuits, such as preservation circuit 140, of a memory device. In one embodiment, timer 240 may be configured to receive the wake-up time from a host device (not shown) so as to be able to modify the rate of rewriting the memory, based on the host device application, the length of time that external power is available, and the like.

In at least one embodiment, timer 240 may be coupled 251 with clock 230 and be driven by clock pulses generated by the clock 230. To illustrate, consider that timer 240 may be set to generate a trigger at a specific wake-up time of, for example, 500 milliseconds (ms). So, for each clock pulse, clock 230 may cause the timer 240 to advance by one count. In some embodiments, clock 230 may cause the timer 240 to advance by one count for each N number of clock pulses, where N>1. When timer 240 counts to the set wake-up time, which may be a triggering event, timer 240 sends a trigger signal through one or both preservation circuit interface 122 and memory bus interface 242 (e.g., via 253 and/or 255), depending on, for example, the source of power with which to perform preservation operations. Timer 240 then may reset itself, and start counting from zero time. For example, in at least one embodiment, clock 230 may be configured with a RC circuit ("RC clock") that generates a clock pulse every 100 ms. From zero time, or reset, with N set to 1, then timer 240 may be configured to count up to 500 ms after 5 clock pulses (100 ms×5=500 ms). If the wake-up time is set at 60 seconds, with N set to 2, then timer 240 may be configured to count up to that time after 300 clock pulses (100 ms×2×300=60 seconds). Upon reaching a wake-up time of 500 ms (or 60 seconds), which is a triggering event, timer 240 sends a trigger signal and resets itself to start counting from zero. Timer 240 does this continuously until the supply of power is terminated, or when a power source (e.g., a battery) reaches, for example, a voltage threshold.

In some embodiments, timer 240 may be configured with a ripple counter or a ripple timer. For example, when using an eight-bit ripple counter, the triggering event may be configured to occur when the ripple counter reaches all ones ("11111111") or all zeros ("00000000"). When associating the triggering event with all zeros, a trigger signal may be sent when the ripple counter counts to zero or when it is reset, for example, by an external reset signal (e.g., coupled with the timer 240 via bus interface 242). A ripple counter may be coupled with a RC clock, in some embodiments. For example, consider that a RC clock, with a clock period of 200 ms (one clock pulse every 200 ms), may be coupled with a ten-bit ripple counter. Thus, trigger circuit 120 may reach a triggering event after every 2,048,000 ms (200 ms×$2^{10}$) or 204.8 seconds.

In some embodiment, timer 240 may be reset by an event external to trigger circuit 120. For example, a power-on (or power-up) event or a power-off (or power-down) event may cause timer 240 to reset. Similarly, trigger circuit 120 (of any of FIGS. 1A to 1C) may be configured with a switch that, when activated, sends a reset signal to timer 240. As used herein, the terms "power on" and "power up" refer, in at least one embodiment, to a condition when electric power starts flowing into a system; into a device, such as a host device or a memory device; or into a component, such as any of the following: trigger circuit 120, preservation circuit 140, memory 160, memory bus 170, memory bus interface 242, and/or memory controller 180. A "power on" or "power up" event may occur under numerous situations, including establishing connectivity to a power source; or when any system, device, or component starts supplying power for any reason to memory device 100, or the like; or when detecting reception of radio frequency ("RF") signals used to generate power for storage in a power source. As one example, consider that when a memory device is attached to or embedded into a host device, the host device may supply power to the memory device, which is a power-up (or power on) event. Similarly, a power-up event may occur when the host is powering-on (or awakening) from a stand-by mode or hibernation mode. In yet another example, the detection of RF signals, which are for power conversion purposes described below, may be considered a power up event. As used herein, the terms "power off" and "power down" may refer, in at least one embodiment, to electric power that stops flowing (or is sufficiently curtailed) into a system, a device, or a component. A "power off" or "power down" event may occur under numerous situations, such as disconnecting from a power source; and interrupting the supply of power, for any reason, by another system, device, or component. In one embodiment, trigger circuit 120 is configured to detect a power down event, and to generate a power-down trigger signal, which, in turn, causes at least one preservation circuit to perform a preservation operation before power to the memory device is sufficiently depleted. The sensing of a power-on event and a power-off event by either at least one trigger circuit or at least one preservation circuit may generate a power-on signal and a power-off signal, respectively.

A wake-up time may be modified, for example, by a software utility, by programming trigger circuit 120, or by changing a switch to a different position. In some embodiments, setting a new wake-up time is a triggering event, which may cause timer 240 to generate a trigger signal. When a new wake-up time is set, timer 240 may reset to zero, and then start counting to the new wake-up time. Timer 240 may be set to any wake-up time from 100 milliseconds to 90 days, or longer. For example, timer 240 may be set to 100 ms, 204 ms, 267 ms, 300 ms, 731 ms, 1021 ms, etc. In some embodiments, timer 240 may be set in units of tenths of seconds or seconds ("s"), such as 0.3 s, 0.8 s, 35 s, 100 s, and so on. In other implementations, timer 240 may be set in units of minutes ("m"), hours ("h"), and days ("d"), such as 1 m, 15 m, 1 h, 6 h, 1 d, 2 d, 10 d, 30 d, 90 d, or longer. For example, one skilled in the art can readily build a timer that accepts the setting of wake-up time in any combination of units, such as 2 d 3 h 25 m 42 s or an equivalent thereof.

In some embodiments, trigger signals are substantially regular and periodic, with substantially uniform intervals between trigger signals. For example, if wake-up time is set at 400 ms, trigger signals may be transmitted every 400 ms (e.g., about 400 ms in between trigger signals). In other embodiments, trigger signals are aperiodic, whereby trigger signals are not separated by substantially the same time period in between. For example, a current trigger signal may come 400 ms (the wake-up time) after a pervious trigger signal, with a subsequent trigger signal coming 917 ms after the current trigger signal. In this example, the time deviates from the wake-up time of 400 ms by as much as 517 ms (917 ms–400 ms). In at least one embodiment, the deviation time may be selected by, for example, a switch, hardware, programming, and/or software. For example, if trigger circuit 120 is set a trigger time of 10 seconds and a deviation time of five seconds, trigger circuit 120 may issue trigger signals separated by a period of about five to 15 seconds. In some embodiments, the deviation time may be expressed in percentage, such as wake-up time plus or minus up to ≈50%. Regardless, trigger circuit 120 may opportunistically issue trigger signals aperiodically as a function of, for example, the bandwidth of a path between a host accessing the memory, whereby trigger circuit 120 issues more trigger signals when there is lower bus usage between a host and the memory, and issues fewer trigger signals when there is higher bus usage. In other embodiments, trigger circuit 120 may opportunistically issue trigger signals aperiodically as a function of, for example, the voltage of a power source (e.g., a battery), whereby trigger circuit 120 may issue more trigger signals per interval of time when there is more charge stored in the power source than when there is less. In one embodiment, the power source may be a battery (e.g., a rechargeable battery), a capacitor, or any other mechanism for storing electrical charge. Another example of a suitable power source may include a Micro-Electro-Mechanical System ("MEMs") flywheel, or the like.

Figure 2B:
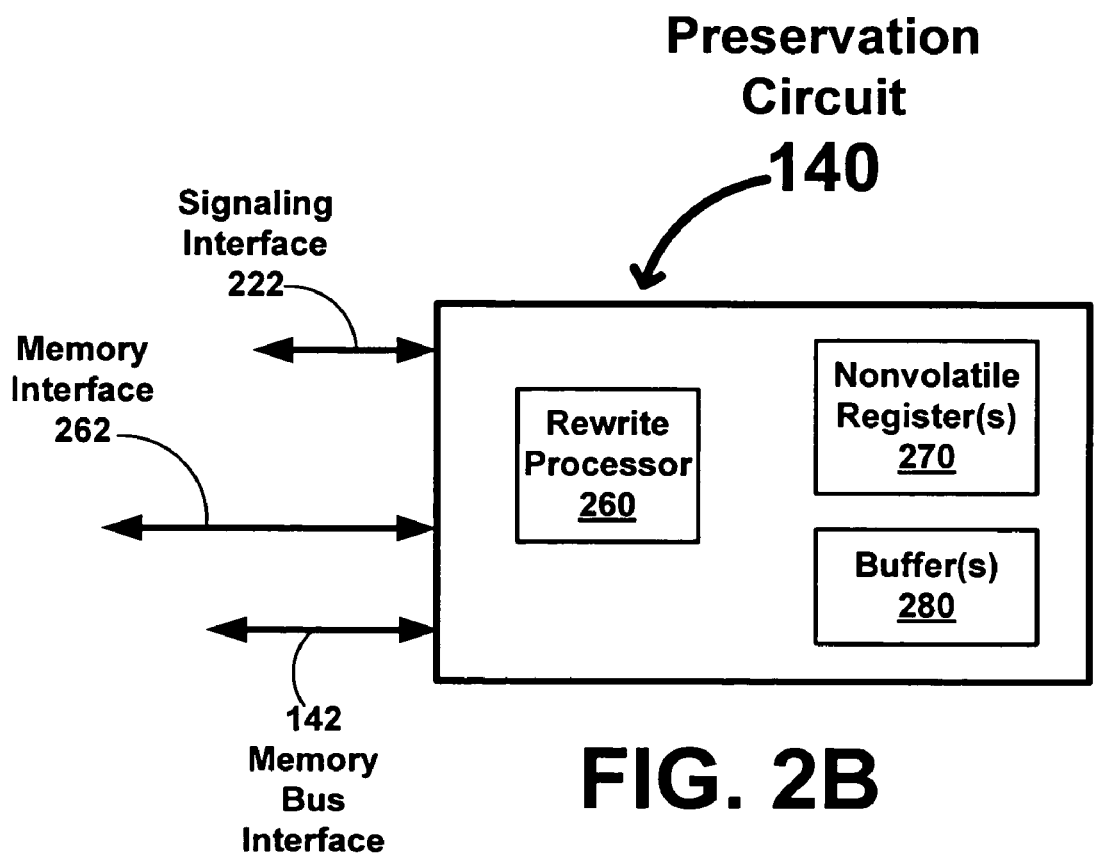
FIG. 2B depicts a block diagram of an exemplary preservation circuit, according to one or more embodiments of the invention.

FIG. 2B depicts an exemplary a preservation circuit configured to include a rewrite processor, according to at least one embodiment of the invention. Preservation circuit 140 includes a rewrite processor 260. In some embodiments, preservation circuit 140 includes one or more nonvolatile registers 270 to maintain memory content information. In some embodiments, preservation circuit 140 includes one or more buffers 280. In some implementations where memory content information does not need to be maintained after power is removed, volatile registers may be used in place of nonvolatile registers 270. Buffer 280 may be sized to hold one or more bits of data. A small buffer may be implemented with a single bit register in a specific embodiment. In some embodiments, preservation circuit 140 includes trigger circuit 120 as shown in FIG. 1C. Preservation circuit 140 may include at least one signaling interface 222 for communicating signals, such as reset signals, power on signals, power off signals, and trigger signals. Trigger signals may come from one or more software utilities, or from a trigger circuit 120. In the latter case, signaling interface 222 may be coupled with preservation circuit interface 122 of trigger circuit 120 to communicate trigger signals. Preservation circuit 140 may also include one or both of memory bus interface 142 and memory interface 262 for communicating control signals and data signals.

In at least one embodiment, preservation circuit 140 may operate to perform reading, writing, and rewriting of memory contents. Examples of reading and writing or storing, in the context of memory access, are described in U.S. patent application Ser. No. 11/095,026, entitled "Memory Using Mixed Valence Conductive Oxides," which involves one example of a resistive-based memory. As used herein, the term "rewriting" or "restoring" in the context of a modifying the contents of memory, in at least one embodiment, refers to writing to a memory with data read from that memory, either from the same location or a different location. For example, in the context of a resistive-based memory, which stores the logic states of data bits by setting resistance values in memory cells, the term "rewriting" may refer to the process of restoring the resistance values to sufficient values for representing the logic states of data bits (e.g., that were previously read from the memory). As an example, each two-terminal memory element may store a single bit of data as one of two distinct conductivity profiles with a first resistive state $R_0$ at a read voltage $V_R$ indicative of a logic "0" and a second resistive state $R_1$ at $V_R$ indicative of a logic "1", where $R_0 \neq R_1$. Preferably, a change in conductivity, measured at $V_R$, between $R_0$ and $R_1$, differs by at least a factor of approximately 10 (e.g., $R_0 \approx 1$ M$\Omega$ and $R_1 \approx 100$ k$\Omega$). The memory elements are not necessarily linear resistors and the resistance of the memory elements may not be a linear function of the voltage applied across the memory elements. Therefore, a resistance R of the memory elements may approximately be a function of the read voltage $V_R$ such that $R \approx f(V_R)$. The $R_0$ and $R_1$ may be retained in the absence of power (e.g., no applied voltage across the two terminals of the memory element) and the application of the read voltage may be non-destructive to the values of $R_0$ and $R_1$. However, the values of $R_0$ and $R_1$ may drift over time due to several factors including but not limited to successive read operations to the same memory element and changes in conductivity of the memory element over time.

If one memory element stores a logic "0" (e.g., $R_0 \approx 1$ M$\Omega$) and another memory element stores a logic "1" (e.g., $R_1 \approx 100$ k$\Omega$), then those values of resistance may drift over time (e.g., after 18 months) such that after a period of time $R_0$ may decrease from about 1 M$\Omega$ to about 600 k$\Omega$ and $R_1$ may increase from about 100 k$\Omega$ to about 350 k$\Omega$. When the read voltage $V_R$ is applied across the two terminals of the two-terminal memory element, a read current $I_R$ flows through the memory element and a magnitude of the read current $I_R$ is indicative of the value of data stored in the memory element. Therefore, for a substantially constant read voltage $V_R$, the magnitude of the read current $I_R$ for the $R_0$ resistive state is lower than the magnitude of the read current $I_R$ for the $R_1$ resistive state. Sense circuitry (e.g., in the logic layer 130) operative to sense the magnitude of the read current $I_R$ and convert the value sensed into a logic voltage level may not be able distinguish between the read currents indicative of the $R_0$ and $R_1$ resistive states if the resistive values for $R_0$ and $R_1$ have drifted as described above. Essentially, unacceptably large amounts of drift in resistive values may result in data corruption. Drift may occur do to several factors including but not limited to the passage of time since the last write operation to a memory element and successive read operations to a memory element. Accordingly, the process of restoring or rewriting is operative to restore the resistive value of $R_0$ from about 600 k$\Omega$ to about 1 M$\Omega$ and to restore the resistive value of $R_1$ from about 350 k$\Omega$ to about 100 k$\Omega$.

The process of restoring or rewriting may include applying an appropriate magnitude of a write voltage $V_W$ across the two terminals of the two-terminal memory element to effectuate writing the $R_0$ or $R_1$ resistive value to a memory element selected for a restore operation. As one example a first magnitude and polarity of a write voltage $V_{W0}$ may be used to effectuate a restore operation on a memory element that stores the $R_0$ resistive value and a second magnitude and polarity of a write voltage $V_{W1}$ may be used to effectuate a restore operation on a memory element that stores the $R_1$ resistive value. After the restore operation, the resistive value of a memory element storing the $R_0$ resistive value will have increased from about 600 k$\Omega$ to about 1 M$\Omega$, for example. Similarly, after the restore operation, the resistive value of a memory element storing the $R_1$ resistive value will have decreased from about 350 k$\Omega$ to about 100 k$\Omega$, for example.

Preservation circuit 140 (of any of FIGS. 1A to 1C) may be configured to respond to a trigger signal by performing a rewrite operation to a memory (or a portion thereof) in a memory device. In a rewrite or restore operation, preservation circuit 140 may read a portion of memory, write the contents from the portion of memory to buffer 280, read the data in buffer 280, and then rewrite the contents back into the memory. In some embodiments, the portion of memory is rewritten to the same location from which it was read. In other embodiments, the portion of memory is rewritten to a different location. In at least one embodiment, preservation circuit 140 is configured without a buffer 280, whereby preservation circuit 140 may perform the rewrite operation by reading a portion of memory from a first location and rewriting the portion of memory to a second location of the memory. In one or more embodiments, preservation circuit 140 is configured to read into its buffer 280 part of a portion of memory, read the remaining of the portion of memory, rewrite the remaining of the portion into the memory, then rewrite the contents of buffer 280 into the memory.

Figure 3A:
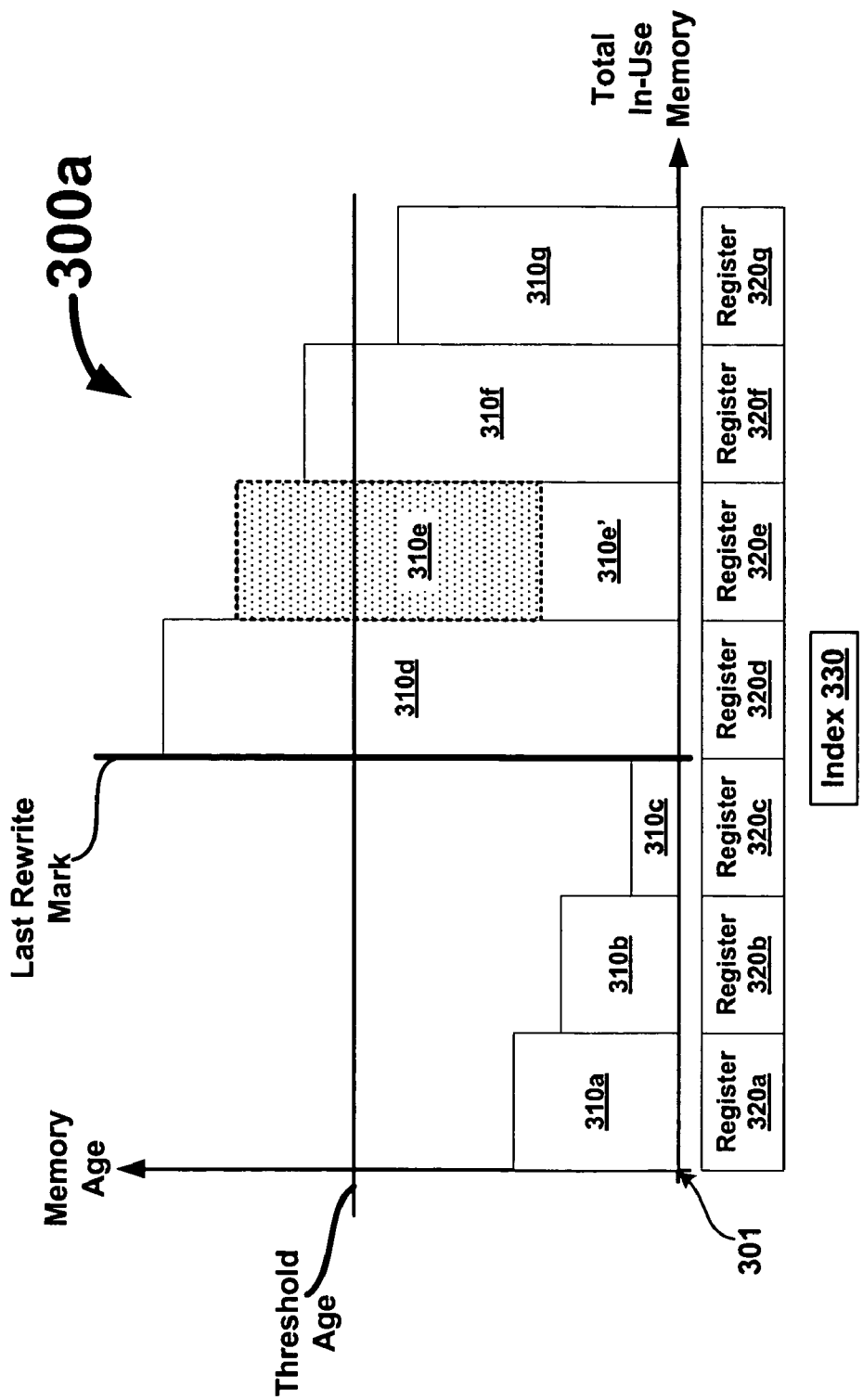
FIG. 3A depicts an exemplary method of restoring memory, according to one or more embodiments of the invention.
Figure 3B:
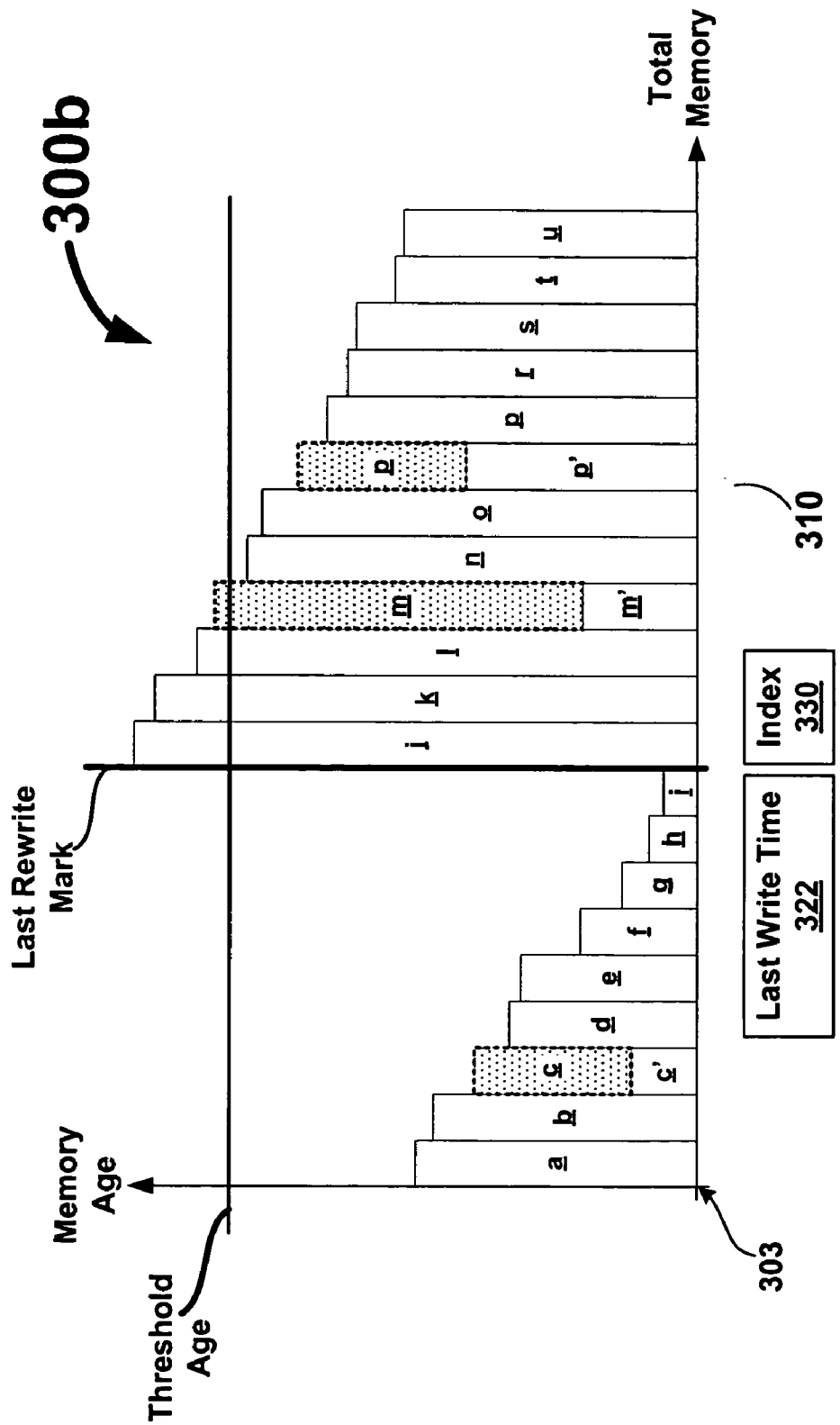
FIG. 3B depicts an alternative exemplary method of restoring memory, according to one or more embodiments of the invention.

Preservation circuit 140 may be configured to perform a rewrite or restore operation according to one or many schemes. A different scheme or process may be programmed into preservation circuit 140. In some embodiments, preservation circuit 140 may be configured with a switch (not shown), such as one discussed above, to select different pre-defined rewrite schemes. FIGS. 3A and 3B depict two exemplary schemes or methods, and merely provide examples by which preservation operations of the various embodiments may be accomplished. In no way are the various embodiments limited to the schemes presented in connection with FIGS. 3A and 3B. One having ordinary skill in the art can practice various embodiments of the invention with other methods or schemes, including one or more schemes derived from those described herein.

FIG. 3A depicts an example of a method 300a that uses two or more registers, according to one or more embodiments of the invention. Registers 320a to 320g may be nonvolatile or volatile, depending on application specific requirements. The x-axis shows the total in-use memory. As used herein, the term "in-use memory" refers, in at least one embodiment, to the portion or portions of memory that is used to store data, regardless of where the data is residing in the memory. For example, if a memory device has a capacity to store four gigabytes (4 GB) of data and 200 megabytes ("MB") of that 4 GB is used to store data, which leaves 3800 MB free and available for storing new data, the total in-use memory is 200 MB. The in-use memory may be in one or more locations of the memory or scattered across the memory. The y-axis shows the memory age of different portions of the in-use memory. As used herein, the term "memory age" refers, in at least one embodiment, to the time period between current time and the time a portion of memory was last written, rewritten or restored for purposes of preservation (e.g., during a power absence period for data retention purposes). For example, if portion 310*a* was last restored 155 seconds ago, the memory age of portion 310*a* is 155 seconds. In this specific scheme 300*a*, the total in-use memory is roughly divided into seven portions 310*a* to 310*g*. In this example, seven registers 320*a* to 320*g* are used to maintain information about the memory contents of the seven portions 310*a* to 310*g* of memory. Index 330, which may be another register, volatile or nonvolatile, may be configured to record which was the last portion of memory rewritten.

In operation, described from an origin 301 of the x-y plane of scheme 300*a*, preservation circuit 140 sits idle, awaiting a trigger signal. Index 330, at this point of operation, points to the last portion of memory rewritten 310*g*, which is the portion, viewed in a loop, before portion 310*a*. When preservation circuit 140 (not shown) detects a trigger signal, it sends a wait signal or a halt signal to lockup memory bus 170 of FIG. 1C for a rewrite operation. A wait signal may be sent when a relatively small portion of the memory is to be rewritten. For example, a few bytes or a few kilobytes. The wait signals stalls access by a host device until a preservation operation expires (i.e., after the few bytes or a few kilobytes are preserved or rewritten). For a larger portion, a halt signal may be sent. Preservation circuit 140 then may send control signals to read the portion of memory after the portion pointed to by index 330. Here, the portion to be read is portion 310*a*. Preservation circuit 140 reads portion 310*a* into its buffer and rewrites or restores portion 310*a* to the memory, either to the location portion 310*a* was read from or to a new location. Preservation circuit 140 then may send a signal to unlock memory bus 170, and updates register 320*a* with a timestamp that marks the current moment. A timestamp may include a date and time down to the milliseconds, for example. In addition, preservation circuit 140 may update index 330 to point to portion 310*a* as the last portion rewritten. Index 330 holds the logical pointer that marks the last time a rewrite operation was performed (last rewrite mark in FIG. 3A). Preservation circuit 140 then goes into idle mode until another trigger signal causes another rewrite operation.

Preservation circuit 140 may be configured to ignore one or more trigger signals. If a trigger signal is not ignored, preservation circuit 140 performs rewrite operation to the next portion 310*b* of in-use memory. A trigger signal then triggers preservation circuit 140 to rewrite portion 310*c* of the in-use memory. At this time, index 330 advances to point to portion 310*c* and the last rewrite mark advances to a position shown FIG. 3A. Note that the next portion of memory to be rewritten, portion 310*d*, immediate to the right of the last rewrite mark, has the oldest memory age. The portion just rewritten, 310*c*, immediate to the left of the last rewrite mark, has the youngest memory.

In some embodiments, a threshold age may be used, the threshold age indicating to preservation circuit 140 which portions to rewrite, in response to the next trigger signal. In particular, all portions of memory with age older than the threshold age may be subject to a preservation operation. As shown, three portions 310*d*, 310*e*, and 310*f* have memory older than the set threshold age. When a next trigger signal comes, preservation circuit 140 may operate to rewrite all three portions 310*d*, 310*e*, and 310*f*. In at least one embodiment, the age of a portion of memory may be updated by other components of a memory device, such as memory controller 180. For example, when new data is written to portion 310*e* by memory controller 180, memory controller 180 updates register 320*e* to record the time portion 310*e* was written. As a result, portion 310*e* has a newer age indicated by 310*e'*. As such, preservation circuit 140 may increase the performance of its rewrite operation by skipping portion 310*e'* when it rewrites memory portions older than the threshold age. The last rewrite mark then advances to after portion 310*f*, last portion rewritten. The next rewrite operation will be performed on portion 310*g*. Preservation circuit 140 then loops back to the origin 301 of the x-y plane, goes idle, and waits for the next trigger signal.

In some embodiments, the threshold age is set according to the power-absence period of a memory. For example, if a memory may maintain its contents for a period of 90 days in the absence of power, the threshold age may be set to at most 90 days. The threshold age is likely to be set at 90 days minus a grace period, such as 90 days minus 15 days, or 75 days. The grace period may be selected according to the natures of an application, condition, or situation the memory will likely to be used in. For example, if a memory with a 90-day power-absence period is likely to be unplugged from a host device for up to 60 days at a time, a likely grace period is 60 days or more. Threshold age for this particular application should be 90 days minus at least 60 days equal at most 30 days. Thus, in this example, no memory portion will be older than 30 days, and the memory may maintain its contents for another 60 days in the absence of power.

FIG. 3B depicts an alternative exemplary method 300*b*, according to one or more embodiments of the invention. This method differs from method 300*a* in three places: (1) the x-axis of method 300*b* shows total memory, (2) method 300*b* divides the memory into more portions, of which 21 portions 310*a* to 310*u* are shown, and (3) method 300*b* uses one register, last write time 322, to record the completion timestamp of the rewrite operation to every portion. By performing preservation operations based on the total memory, rather than in-use memory, method 300*b* favors applications that frequently use close to the maximum capacity, 4 GB for example, of the memory.

Preservation circuit 140, in accordance with method 300*b*, may perform substantially the same operation as in method 300*a*, except in relation to two features. At the completion of a rewrite operation on any portions 310*a* to 310*u*, preservation circuit 140 writes the current timestamp into last write time register 322. Before a rewrite operation, preservation circuit 140 determines how many portions to rewrite with two timestamps: the current timestamp and the timestamp recorded in last write time 322. In a first example, if preservation circuit 140 is configured to rewrite the entire memory in 21 days and current time is five days after the time recorded in last write time 322, preservation circuit 140 will rewrite five portions 310*j* to 310*n* after the portion 310*i* pointed to by index 330. In a second example, if preservation circuit 140 is configured to rewrite the entire memory in 42 hours and current time is four hours after the time recorded in last write time 322, preservation circuit 140 will rewrite two portions 310*j* and 310*k* after the portion 310*i* pointed to by index 330. If method 300*b* also implements memory threshold age in the second example, two additional portions 310*l* and 310*m* will be included in the rewrite operation that is described above.

In some embodiments, method 300*b* may be implemented with one or more registers (not shown) to record the rewrite time of each memory portion, as in method 300*a*. In such embodiments, memory age of memory portions, such as 310*c'*, 310*m'*, and 310*p'*, may be updated by other components of the memory device, such as the memory controller 180, when the contents of these memory portions are modified or written. As such, a memory portion with an age below the threshold age will not be included in the next rewrite operation.

As shown and described in relation to FIGS. 3A and 3B, many rewrite or restore schemes are possible within the scope of the various embodiments of the invention. Some features depicted in FIGS. 3A and/or 3B may be eliminated or combined with other features. In some embodiments, preservation circuit 140 may be configured to rewrite all memory in response to a trigger signal. In at least one embodiment, preservation circuit 140 is coupled with a switch, such as one described above, to provide an additional input to preservation circuit 140 in its determination of what portions of memory to rewrite. A switch may be configured to include two or more positions, and the meanings of the positions may be changed. For example, a switch may be configured with four positions—p1, p2, p3, and p4—that indicate to preservation circuit 140 to rewrite 25%, 50%, 75%, and 100% of the memory, respectively. The meanings of these positions (p1, p2, p3, and p4) may be reprogrammed, or otherwise changed, to indicate to preservation circuit 140, for example, to rewrite: (p1) 100% on a power-on event, (p2) 0% on power-on event, (p3) follow a predetermined scheme, for example, as described in FIG. 3A or 3B, and (p4) 100% when memory is not being access by memory controller 180 in, for example, 30 minutes.

In one of more embodiments, preservation circuit 140 may be configured to follow multiple preservation schemes, depending on different trigger signals. For example, a power-on signal or power-off signal will trigger rewriting of the entire memory; a trigger signal from trigger circuit 120 will trigger rewriting of a portion or portions of the memory, as illustrated in FIG. 3A or 3B; and a reset signal will trigger no rewrite operation other than resetting the registers in preservation circuit 140 to pre-defined states.

Figure 4:
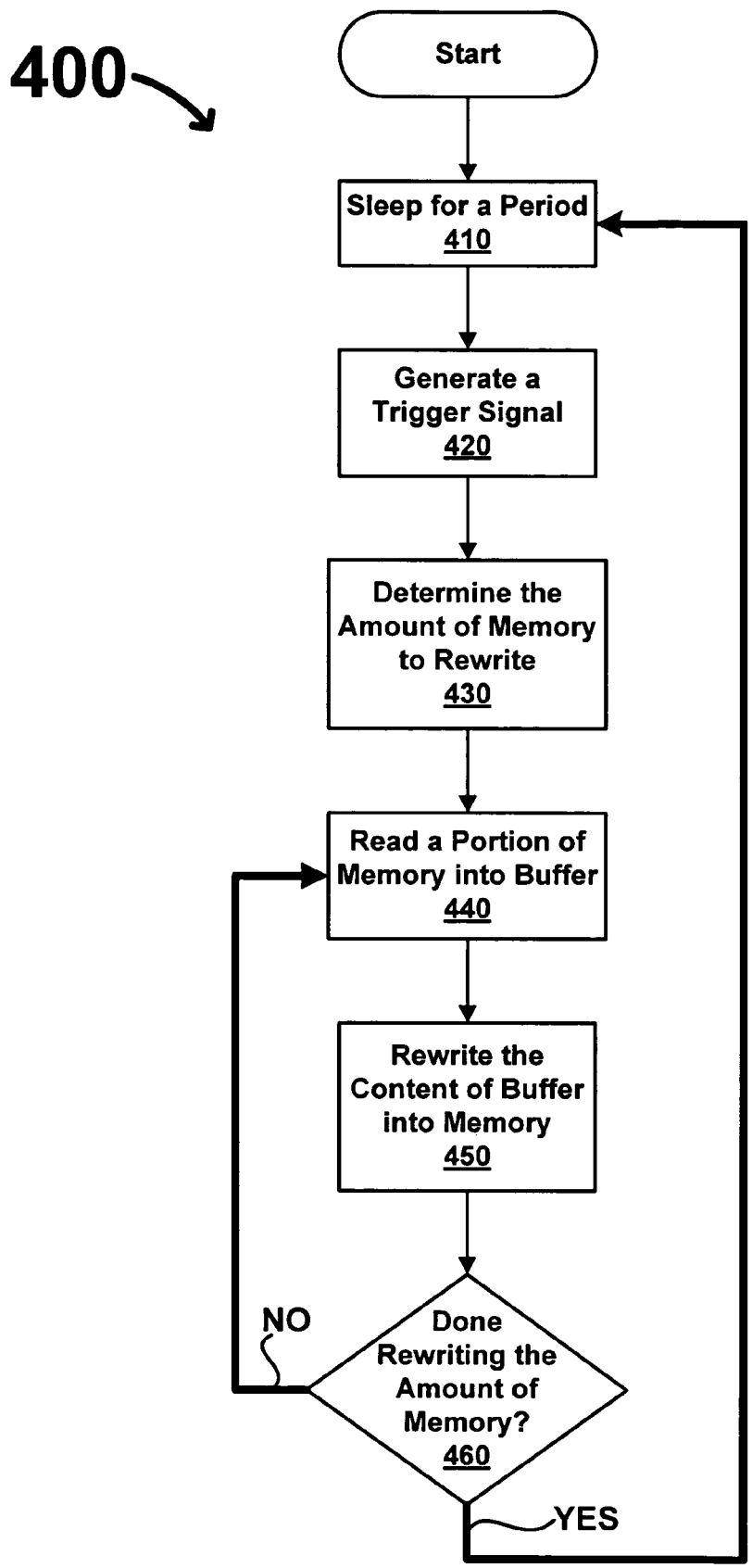
FIG. 4 is a flow diagram depicting an exemplary method of restoring memory, according to one or more embodiments of the invention.

FIG. 4 is a flow diagram 400 depicting an exemplary method for rewriting or restoring memory, according to at least one embodiment of the invention. In some embodiments, a method performs a subset of flow diagram 400 and may perform one or more functions, each of which is not shown in FIG. 4 to avoid unnecessarily obscuring the description. Note that flow diagram 400 and its constituent elements may be performed by one or more of the following: a software utility, a memory device, a trigger circuit, a preservation circuit, a memory controller, or any device implementing or mimicking a memory device, such as an electronic device or a computer program executing instructions to manage information or a database.

Flow diagram 400 shows that a memory may sleep (e.g., placed into a state of low or no power consumption) during a stage 410. In some embodiments, stage 410 may be skipped at the initial start (but not after a stage 460, in some cases). At stage 410, flow diagram 400 waits, delays, sleeps, idles, or otherwise stays inaction for a period of time ("delay period"). The delay period may be any length of time from 100 milliseconds to days, for example, 90 days, and longer. The delay period may be changed anywhere (not shown) in flow diagram 400. The passing, expiring or lapsing of the delay period is a triggering event that may cause flow diagram 400 to advance to a stage 420.

At stage 420, a trigger signal is generated, created, issued, sent, or otherwise broadcasted to one or more components, devices, systems, and entities that are configured to receive the trigger signal. In some embodiments, a receiver of the trigger circuit is preservation circuit 140. In at least one embodiment, a software utility receives the trigger signal. The trigger circuit may be generated by the receiving software utility itself, trigger circuit 120, another software utility, or another device or component. There may be more than one receiver, for example, preservation circuits 140, 140a, and 140b in FIG. 1C may all receive the trigger signal.

The receiver or receivers of the trigger signal, at a stage 430, may determine the amount of memory to rewrite. Determining the amount of memory to rewrite may follow one or more methods described above, a method modified from those described above, or a new method. Determining the amount of memory includes determining the starting point, i.e., the starting memory address, of the amount of memory. When the amount is computed, a rewrite operation begins at a stage 440. To rewrite the amount of memory, a portion is read from the memory from the starting memory address. The memory may be read into a buffer. For example, if a software utility is performing the rewrite operation, a part of the allocated memory of the system, on which the software utility is executed, may be used as a buffer. If a preservation circuit is performing the rewrite operation, it may be configured with a buffer to hold the portion of memory.

At a stage 450, the portion of memory is read from the buffer and written or rewritten back to the memory at the same starting memory address or a different starting memory address. In some embodiment, a buffer is not used, and the portion of memory is read from a first location of the memory and written or rewritten into a second location of the memory. At a stage 460, an amount of memory that has been rewritten is determined. If rewriting is not done, the flow goes back to reading at the stage 440 and rewrites at the stage 450, to read and rewrite the next portion of the memory, and keeps on reading and rewriting until the amount of memory has been rewritten, at which point, the flow returns to the stage 410. At stage 410, since the length of the delay period may have been changed since the last delay, the delay period is determined before going to sleep. Flow diagram 400 continues until it is terminated, or for example, power to a preservation circuit that carries out the processes is lost. Flow diagram 400 may terminate when a software utility that executes instructions carrying out the flow diagram 400 is stopped.

A computer-implemented or computer-executable version of the flow diagram 400 or part of the flow diagram 400 may be embodied using, stored on, or associated with computer-readable medium. A computer-readable medium may include hard disks and any medium that participates in providing instructions to one or more processors for execution. Such a medium may take many forms including, but not limited to, nonvolatile, volatile, and transmission media. Nonvolatile media includes, for example, Flash memory, optical disks, or magnetic disks or tapes. Volatile media includes static or dynamic memory, such as SRAM or DRAM. Transmission media includes coaxial cables, copper wire, fiber optic lines, and wires arranged in a bus. Transmission media may also take the form of electromagnetic, radio frequency, acoustic, or light waves, such as those generated during radio wave and infrared data communications.

For example, a binary, machine-executable version, of the software of the present invention may be stored or reside in DRAM, Flash memory, or on a mass storage device (e.g., hard disk, magnetic disk, tape, or CD-ROM). The source code of the software of the present invention may also be stored or reside on mass storage device. As a further example, code of various embodiments of the invention may be transmitted via wires, radio waves, or through a network such as the Internet or a local area network. Computer software products may be written in any of various suitable programming languages, such as Java, JavaScript, Perl, C, C++, C#, or Visual Basic, for example.

FIG. 5 depicts an example of a memory device 110 including an on-board power supply 501, according to one or more embodiments of the invention. Power supply 501 includes an RF-to-DC converter 510 coupled 512 with a battery 530, both of which may be connected 512 with a power bus 540. In some embodiments, power supply 501 may include an antenna 520 connected 522 with RF-to-DC converter 510. Memory device 110 includes an internal memory device 100. Internal memory device 100 may be, for example, any memory device comprising a memory, a trigger circuit, and a preservation circuit, such as depicted in either FIG. 1A, 1B, or 1C. The memory, trigger circuit, and preservation circuit may be formed in one IC chip or multiple chips. For example, the memory in one or more chips and the trigger circuit and preservation circuit in a separate chip together, or each circuit in a different chip. In some embodiments, memory controller 180 is located inside internal memory device 100 (FIG. 1B). In other embodiments, memory device 110 includes memory controller 180 outside internal memory device 100. Memory controller 180 connects, attaches, or otherwise couples host device 190 via host device interface 182 to internal memory device 100 via memory bus 170. When memory device 110 is coupled with host device 190, power bus 540 is connected with host device 190, which supplies power to memory device 110. Power bus 540 is configured to supply power to memory controller 180 and internal memory device 100. Electrical power may flow from host device 190, RF-to-DC converter 510, and/or battery 530.

RF-to-DC converter 510 receives RF signals 518 in a range of frequencies, for example, from 800 to 1000 megahertz, through antenna 520 or through an antenna (not shown) on host device 190. RF-to-DC converter 510 is configured to convert RF signals 518 into, for example, direct current ("DC") power. In at least one embodiment, RF-to-DC converter 510 may be implemented with a Powercast® circuit, designed by Powercast, LLC, of Ligonier, Pa., USA. The Powercast) circuit may be further configured to receive RF signals 518 from a nearby RF signal transmitter. For example, when RF-to-DC converter 510 is placed within 10 feet of the nearby transmitter, RF-to-DC converter 510 receives RF signals 518 from the transmitter and converts the signals into electricity. The power may be stored in battery 530. RF-to-DC-converter 510 may also directly power trigger circuit 120, preservation circuit 140, and memory 160 for internal memory device 100 (FIGS. 1A to 1C) in rewrite operations. In some embodiments, RF-to-DC converter 510 receives RF signals 518 from sources typically found in an operating environment, and, thus, does not require a transmitter to provide a source of RF signals 518.

Battery 530 is configured to store electricity for use in rewrite operations. In some embodiments, memory device 110 includes a power management circuit 181. In one embodiment, power management circuit 181 may be formed within, memory controller 180. Power management circuit 181 may operate to manage power storage and usage in memory device 110. For example, when memory device 110 is embedded or attached to host device 190, power management circuit 181 directs power from host device 190 to memory controller 180, trigger circuit 120, and preservation circuit 140, as well as to battery 530 to recharge it. When power seizes to flow (or, alternatively, drops below a threshold for voltage produced by battery 530) from host device 190, for any reason, power management circuit 181 may disconnect memory controller 180, memory 160, and preservation circuit 140 from power bus 540 to preserve power in battery 530. Battery 530 supplies power to trigger circuit 120 to drive clock 230 and timer 240. When trigger circuit 120 sends or broadcasts a trigger signal, the power management circuit 181 supplies power from battery 530 to preservation circuit 140 and memory 160 for the rewrite operation. After the rewrite operation, power to preservation circuit 140 and memory 160 are cut off. Power is turned on again for the next rewrite operation, and so on.

In some embodiments, battery 530 may be configured to have a size and/or charge storage capacity suitable for a particular application or environment in which memory device 110 is designed to operate. For example, the charge storage capacity of battery 530 may be sufficient enough to store enough power for one rewrite operation. Charging a small battery 530 may use a relatively small RF-to-DC converter 510, whereby the size determination may be a function of a variety of factors, such as the power absence period, the form-factor requirements, the environment in which battery 530 operates, and the like. A relatively small converter and relatively small battery help reduce the cost, size, and weight of memory device 110. To further reduce the cost, size, and weight, trigger circuit 120 may be configured with a RC clock coupled with a ripple counter. In these specific embodiments, preservation circuit 140 may be designed to perform a rewrite operation that does not require more power than may be supplied by the small battery. For example, the portion of memory to rewrite may be programmed to be small, such as a few kilobytes or a few megabytes. Trigger circuit 120 may be designed to operate in accordance with an opportunistic behavior that does not send trigger signals sooner than battery 530 may be recharged. In operations, when host device 190 does not supply power to memory device 110, memory 160 may be kept fresh by numerous cycles of charging up the battery and rewriting a small portion of the memory. Successive charging-rewriting cycles ensure memory device 110 to maintain the contents of memory 160.

In a variety of embodiments, a trigger circuit may include a resistor-capacitor ("RC") oscillator clock configured to generate clock pulses, and a ripple timer coupled with the RC oscillator clock, the ripple timer configured to generate the trigger signal. A trigger circuit may include a real-time clock. In some embodiments, a preservation circuit may include a buffer, and the preservation circuit is further configured to read the logic states of a portion of the multiple layers of memory from a first location, to store values that represent the logic states in the buffer, and to rewrite the values that represent the logic states to a second location of the multiple layers of memory, thereby preserving the resistance values associated with the logic states. A portion of the multiple layers of memory may be determined with the input of a threshold age. In at least one instance, the second location is the first location. In a specific embodiment, the preservation circuit may be configured to ignore at least one previous trigger signal.

According to at least one embodiment, a memory device may be configured to exchange data with a host, the memory device comprising a memory that comprises multiple layers of memory cells. Further, the memory device may include a preservation circuit coupled with the multiple layers of memory cells, the preservation circuit being configured to restore a resistance value associated with a data bit stored in one of the memory cells in response to a trigger signal, and a memory controller coupled with the memory, the memory controller being configured to interact with the host.

In accordance with one embodiment, a method includes detecting a trigger signal, reading a portion of memory from a first location into a buffer, wherein the portion of the memory is stored in a resistive-based, nonvolatile memory, and rewriting the portion of memory from the buffer into a second location of the memory. In one instance, the second location is the first location. The method also may include determining the portion of the memory to read. A portion of the memory may be determined with the input of a threshold age. In some embodiments, the method may also include storing, in a first register, a memory location corresponding to the end of the portion of the memory, and storing, in a second register, information associated with the writing of the portion of memory from the buffer into a second location of the memory.

An integrated circuit may be configured to rewrite a memory configured to store logic states associated with resistance values, according to an embodiment. The integrated circuit may include a trigger circuit configured to (1) detect a triggering event, and (2) generate a trigger signal. The integrated circuit may also include a preservation circuit, coupled with the trigger circuit, and configured to (1) respond to the trigger signal, and (2) preserve the resistance values of a portion of the memory to represent the logic states. Further, the trigger circuit may comprise a resistor-capacitor ("RC") oscillator clock configured to generate clock pulses, and a ripple timer coupled with the RC oscillator clock, the ripple timer configured to generate the trigger signal.

A computer-readable medium, according to one embodiment, may include executable instructions stored thereon and configured to (1) sleep for a first period of time, and (2) send a trigger signal to a preservation circuit in a memory device, wherein the memory device comprises at least a resistive-based, nonvolatile memory cell. The executable instructions to send the trigger signal may further include executable instructions to apply power to the memory device. And the computer-readable medium may further include executable instructions to (1) sleep for a second period of time, and (2) remove power from the memory device.

Various embodiments of the invention enable hosts or host devices to be configured to save power with one or more power saving modes. For example, a host may be configured to turn off power to a memory port when a memory device coupled with that port is not used. Power may be turned on selectively when access to the memory device is needed. The memory device, according to at least one embodiment of the invention, is able to maintain its contents with minimal power consumption due to the various schemes of slow restore or rewrite.

The foregoing description, for purposes of explanation, used specific nomenclature to provide a thorough understanding of the various embodiments of the invention. However, it will be apparent to one skilled in the art that specific details are not required in order to practice the various embodiments of the invention. In fact, this description should not be read to limit any feature or aspect of the present invention to any embodiment; rather features and aspects of one embodiment may readily be interchanged with other embodiments.

Thus, the foregoing descriptions of specific embodiments of the various embodiments of the invention are presented for purposes of illustration and description. They are not intended to be exhaustive or to limit the various embodiments of the invention to the precise forms disclosed; many alternatives, modifications, equivalents, and variations are possible in view of the above teachings. For the purpose of clarity, technical material that is known in the technical fields related to the embodiments has not been described in detail to avoid unnecessarily obscuring the description. Thus, the various embodiments may be modified within the scope and equivalents of the appended claims. Further, the embodiments were chosen and described in order to best explain the principles of the embodiments of the invention and their practical applications; they thereby enable others skilled in the art to best utilize various embodiments of the invention with various modifications as are suited to the particular use contemplated. Notably, not every benefit described herein need be realized by each embodiment of the present invention; rather any specific embodiment may provide one or more of the advantages discussed above. In the claims, elements and/or operations do not imply any particular order of operation, unless explicitly stated in the claims. It is intended that the following claims and their equivalents define the scope of the various embodiments of the invention.

What is claimed is:

1. A memory device comprising:
   at least one layer of memory including a plurality of memory cells, each memory cell configured to store logic states associated with resistance values; and
   a preservation circuit electrically coupled with the plurality of memory cells and configured to, in response to a trigger signal, restore the resistance values to represent the logic states,
   wherein the preservation circuit is further configured to preserve the resistance values of a subset of the plurality of memory cells.

2. A computer-readable medium including executable instructions configured to perform steps comprising:
   sleeping for a period of time;
   determining a portion of memory to read, the memory including a plurality of resistive-based, nonvolatile memory cells;
   reading the portion of the memory from a first location into a buffer; and
   rewriting the portion of memory into a second location of the memory.

3. The computer-readable medium of claim 2, wherein the sleeping for the period of time comprises sleeping for at least 500 milliseconds.

4. The computer-readable medium of claim 2, wherein the second location comprises the first location.

5. The computer-readable medium of claim 2, wherein the sleeping for the period of time further comprises operating a clock in a host to count a number of time units associated with the period of time.

\* \* \* \* \*